United States Patent
Li et al.

(10) Patent No.: US 9,224,809 B2
(45) Date of Patent: Dec. 29, 2015

(54) FIELD EFFECT TRANSISTOR STRUCTURE COMPRISING A STACK OF VERTICALLY SEPARATED CHANNEL NANOWIRES

(71) Applicant: The Board of Trustees of the University of Illinois, Urbana, IL (US)

(72) Inventors: Xiuling Li, Champaign, IL (US); Yi Song, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 59 days.

(21) Appl. No.: 13/896,537

(22) Filed: May 17, 2013

(65) Prior Publication Data

US 2014/0353574 A1    Dec. 4, 2014

Related U.S. Application Data

(60) Provisional application No. 61/648,246, filed on May 17, 2012.

(51) Int. Cl.
| | |
|---|---|
| *H01L 29/06* | (2006.01) |
| *H01L 29/10* | (2006.01) |
| *H01L 29/20* | (2006.01) |
| *H01L 29/205* | (2006.01) |
| *H01L 29/78* | (2006.01) |
| *H01L 29/423* | (2006.01) |
| *H01L 29/786* | (2006.01) |

(52) U.S. Cl.
CPC ........ *H01L 29/0673* (2013.01); *H01L 29/1054* (2013.01); *H01L 29/20* (2013.01); *H01L 29/2003* (2013.01); *H01L 29/205* (2013.01); *H01L 29/42392* (2013.01); *H01L 29/7841* (2013.01); *H01L 29/7869* (2013.01)

(58) Field of Classification Search
CPC .................. H01L 29/0665; H01L 29/0673
USPC ............................................. 257/9
See application file for complete search history.

(56) References Cited

U.S. PATENT DOCUMENTS

| 7,135,728 B2 * | 11/2006 | Duan et al. ............ 257/296 |
| 8,178,862 B2 * | 5/2012 | Colinge ............ 257/9 |
| 2008/0135949 A1 | 6/2008 | Lo et al. ............ 257/401 |

OTHER PUBLICATIONS

Chen, et al., "High-Performance III-V MOSFET with Nano-stacked High-k Gate Dielectric and 3D Fin-Shaped Structure," *Nanoscale Research Letters*, 7 431 (2012) pp. 1-5.
Dupré-C-et-al., "3D Nanowire Gate-All-Around Transistors: Specific Integration and Electrical Features," *Solid State Electronics*, 52, 4 (2008) Abstract Only.
Cho, Seongjae et al., "RF Performance and Small-Signal Parameter Extraction of Junctionless Silicon Nanowire MOSFETs," *IEEE Transactions on Electronic Devices*, 58, 5 (2011) 1388-1396.
Dupre, C. et al., "3D nanowire gate-all-around transistors: Specific integration and electrical features," *Solid-State Electronics*, 52 (2008) 519-525.

(Continued)

*Primary Examiner* — Monica D Harrison
(74) *Attorney, Agent, or Firm* — Brinks Gilson & Lione

(57) ABSTRACT

A field effect transistor structure comprises a source and a drain on a substrate, and a stack of n vertically separated channel nanowires isolated from the substrate and connecting the source and the drain, where n is an integer and $2 \leq n \leq 20$. The channel nanowires collectively comprise at least two different thicknesses and/or at least two different dopant concentrations and/or at least two different semiconductor materials.

24 Claims, 17 Drawing Sheets

(56) References Cited

OTHER PUBLICATIONS

Eminente, Simone et al., "Comparative analysis of the RF and noise performance of bulk and single-gate ultra-thin SOI MOSFETs by numerical simulation," *Solid-State Electronics*, 48 (2004) 543-549.

Gu, J. J. et al., "First Experimental Demonstration of Gate-all-around III-V MOSFETs by Top-down Approach," *IEDM Tech. Dig.* (2011) 769-772.

Ho, C. S. et al., "Determination of gate-bias dependent source/drain series resistance and effective channel length for advanced MOS devices," *Solid-State Electronics*, 50 (2006) 1774-1779.

Kang, Sanghoon et al., "Linearity Analysis of CMOS for RF Application," *IEEE Transactions on Microwave Theory and Techniques*, 51, 3 (2003) 972-977.

Kaya, Saves et al., "Optimization of RF Linearity in DG-MOSFETs," *IEEE Electron Device Letters*, 25, 5 (2004) 308-310.

Kim, Tae Wook et al., "Highly Linear Receiver Front-End Adopting MOSFET Transconductance Linearization by Multiple Gated Transistors," *IEEE Journal of Solid-State Circuits*, 39, 1 (2004) 223-229.

Lee, Byoung Hun et al., "Metal Electrode/High-*k* Dielectric Gate-Stack Technology for Power Management," *IEEE Transactions on Electron Devices*, 55, 1 (2008) 8-20.

Li, Yiming et al., "Investigation of Electrical Characteristics on Surrounding-Gate and Omega-Shaped-Gate Nanowire FinFETs," *IEEE Transactions on Nanotechnology*, 4, 5 (2005) 510-516.

Liu, F. et al., "A Charge-Based Model for Long-Channel Cylindrical Surrounding-Gate MOSFETs From Intrinsic Channel to Heavily Doped Body," *IEEE Transactions on Electron Devices*, 55, 8 (2008) 2187-2194 (Abstract only).

Parrish, Kristen N. et al., "Impact of contact resistance on the transconductance and linearity of graphene transistors," *Applied Physics Letters*, 98 (2011) 183505-1-183505-3.

Perumana, Bevin G. et al., "Resistive-Feedback CMOS Low-Noise Amplifiers for Multiband Applications," *IEEE Transactions on Microwave Theory and Techniques*, 56, 5 (2008) 1218-1225.

Razavieh, Ali et al., "A New Method to Achieve RF Linearity in SOI Nanowire MOSFETs," *IEEE Radio Frequency Integrated Circuits Symposium*, Baltimore, MD (Jun. 5-7, 2011) 167-170.

Song, Yi et al., "Performance Breakthrough in Gate-All-Around Nanowire n- and p-Type MOSFETs Fabricated on Bulk Silicon Substrate," *IEEE Transactions on Electron Devices*, 59, 7 (2012) 1885-1890.

Ye, P. D. et al., "GaAs metal-oxide-semiconductor field-effect transistor with nanometer-thin dielectric grown by atomic layer deposition," *Applied Physics Letters*, 83, 1 (2003) 180-182.

\* cited by examiner

FIELD EFFECT TRANSISTOR STRUCTURE COMPRISING A STACK OF VERTICALLY SEPARATED CHANNEL NANOWIRES

RELATED APPLICATIONS

This application claims priority under 35 U.S.C. §119(e) to U.S. Provisional Patent Application No. 61/648,246, which was filed on May 17, 2012, and which is hereby incorporated by reference in its entirety.

FEDERALLY FUNDED RESEARCH OR DEVELOPMENT

The invention described herein was made with government support under contract number N000141110634 awarded by the Office of Naval Research (ONR). The U.S. Government has certain rights in this invention.

TECHNICAL FIELD

The present disclosure is related generally to transistor structures and more particularly to field effect transistors that include stacked nanowires.

BACKGROUND

For transistors used for radio frequency (RF) communications, linearity is a crucial consideration for minimizing high order harmonics and intermodulation in order to achieve less distortion between input and output signals. Transistor transconductance ($g_m$) constitutes a dominant factor for the non-linearity of RF amplifiers and other circuit elements at high frequency. Unfortunately, nonlinearity tends to be an inherent property of conventional transistors because of mobility degradation at high fields, as well as bias-dependent source/drain (S/D) resistance and channel length modulation (CLM) effect. In addition, high linearity is extremely difficult to achieve for low power application and at room temperature. There are many reports of linearity improvements at the circuit level by integrating and individually addressing discrete devices; however, such schemes require more resources and a larger footprint.

BRIEF SUMMARY

Described herein is a field effect transistor structure that may allow high linearity to be achieved at low power and at room temperature for RF applications. A method of making such transistor structures is also described.

According to one embodiment, the field effect transistor structure comprises a source and a drain on a substrate, and a stack of n vertically separated channel nanowires which are isolated from the substrate and which connect the source and the drain, where n is an integer and 2≤n≤20. The channel nanowires collectively comprise at least two different thicknesses and/or at least two different dopant concentrations and/or at least two different semiconductor materials.

According to another embodiment, the field effect transistor structure comprises a source and a drain on a substrate, and a stack of n vertically separated channel nanowires which are isolated from the substrate and which connect the source and the drain, where n is an integer and 2≤n≤20. A gate electrode is adjacent to the stack of channel nanowires, and, over a gate bias ($V_{gs}$) range of at least about 300 mV, a transconductance ($g_m$) of the MOSFET device decreases less than about 10% from a maximum transconductance ($g_{m,max}$).

A method of making a field effect transistor structure includes epitaxially growing a stack of layers on a substrate. The stack of layers includes n sacrificial layers comprising a first semiconductor material alternating with n channel layers comprising a second semiconductor material, where n is an integer and 2≤n≤20. A source and a drain are formed on the substrate alongside the stack of layers on a first side and a second side thereof, respectively, such that the stack of layers connects the source and the drain. Material is removed from a third side and a fourth side of the stack of layers to define a stack of wires of a predetermined width connecting the source and the drain. The stack of wires comprises sacrificial nanowires comprising the first semiconductor material alternating with channel nanowires comprising the second semiconductor material. The sacrificial nanowires are removed so as to isolate the channel nanowires, and thus a stack of vertically separated channel nanowires which are isolated from the substrate and which connect the source and the drain are formed.

DETAILED DESCRIPTION

The present disclosure provides a new method and device structure to realize high linearity for field effect transistors such as metal-oxide-semiconductor field effect transistors (MOSFETs). The device structure comprises a stack of vertically separated semiconductor nanowires engineered to achieve nearly flat transconductance profiles as a function of applied bias at room temperature, which is indicative of high linearity. The doping levels and dimensions of the nanowires, as well as the type of semiconductor, may be adjusted to achieve the desired electrical performance in RF applications.

Figure 1A:
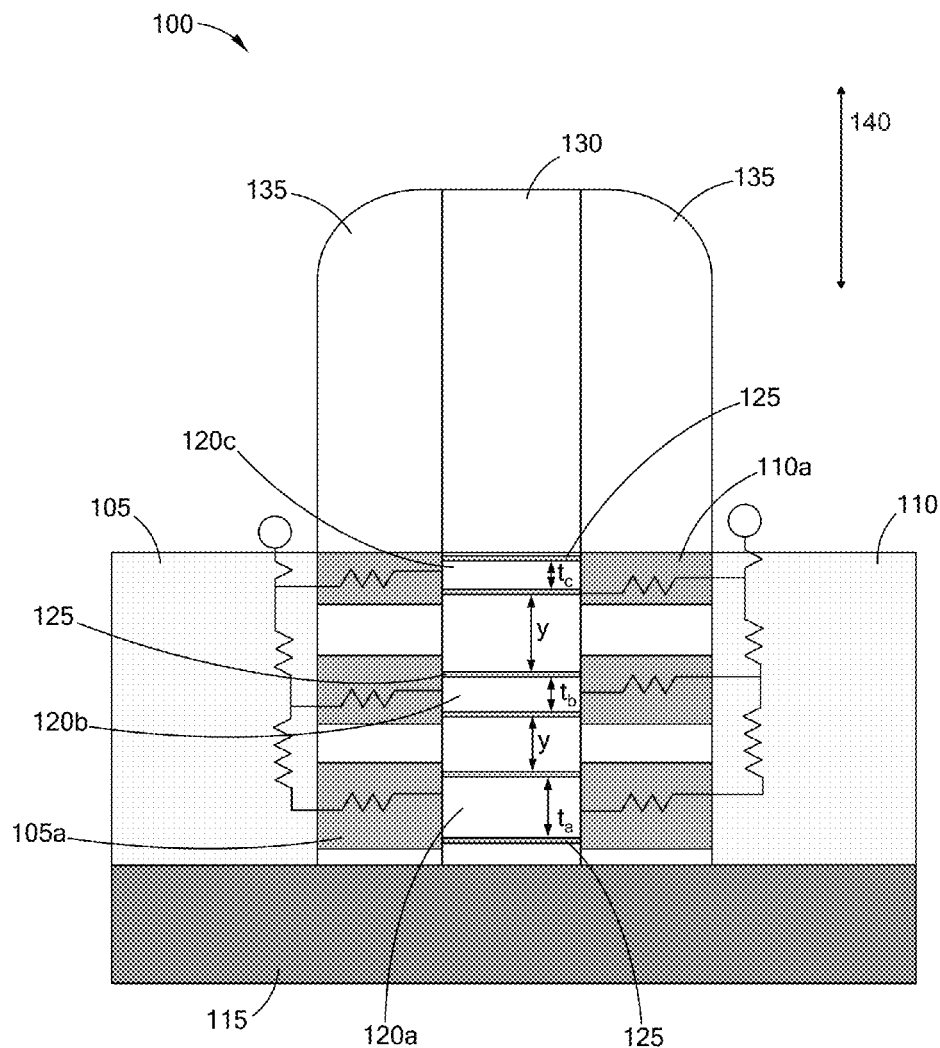
FIGS. 1A and 1B are schematic illustrations of exemplary vertically stacked nanowire MOSFETs: (A) shown in cross-section with a gate-all-around structure; and (B) shown in a three-dimensional perspective view without the gate.
Figure 1B:
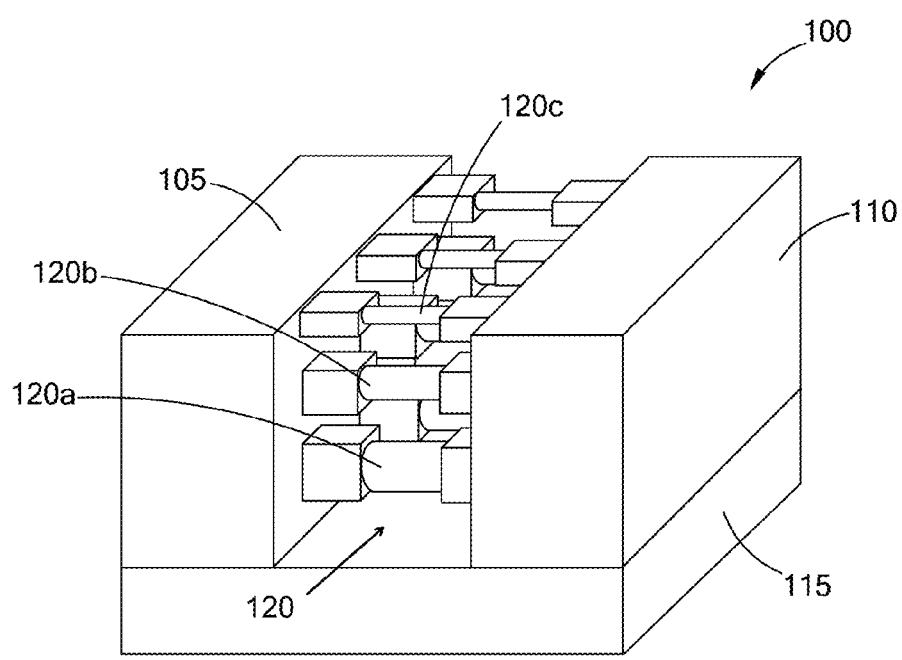

An exemplary device structure for a proposed MOSFET is shown in FIGS. 1A and 1B. The device 100 includes a source 105 and a drain 110 on a substrate 115 and a stack 120 of three vertically separated channel nanowires 120a, 120b, 120c that connect the source 105 to the drain 110. The channel nanowires are electrically isolated from the substrate 115 and a gate electrode 130 by a gate dielectric layer 125, which may conformally coat or surround each of the channel nanowires 120a, 120b, 120c. The gate electrode 130 is disposed over the gate dielectric layer 125 and may have any of several possible configurations, as discussed further below.

As shown in FIGS. 1A and 1B, the vertically separated channel nanowires 120a, 120b, 120c are stacked and separated from each other in a vertical direction 140, which may be taken to be substantially perpendicular to a surface of the substrate 115. Additionally, there may be more than one stack of nanowires connecting the source 105 and the drain 110.

The channel nanowires 120a, 120b, 120c may comprise a semiconducting material, such as elemental semiconductors Si and Ge or a compound semiconductor such as GaAs, AlGaAs, InAs, InGaAs, InSb, GaSb, InGaSb, InP, GaP, InGaP, InN, GaN, and InGaN.

Use of a high electron mobility material, such as GaAs, may be advantageous. The substrate 115 may comprise a semi-insulating material that is lattice-matched with the semiconducting material of the channel nanowires. For example, if the semiconducting material comprises GaAs, then the semi-insulating material may be semi-insulating GaAs. The source 105 and the drain 110 may comprise any of the semiconducting materials mentioned above and further may be highly doped with a dopant concentration of at least about $10^{18}$ cm$^{-3}$.

In the exemplary MOSFET structure of FIGS. 1A and 1B, the channel nanowires 120a, 120b, 120c have three different thicknesses, indicated as $t_a$, $t_b$, and $t_c$, respectively. That is, each of the three channel nanowires 120a, 120b, 120c has a different thickness than the other nanowires. The channel nanowires 120a, 120b, 120c may also comprise three different dopant concentrations, which may be referred to as $N_a$, $N_b$, and $N_c$, respectively. In other words, each of the three channel nanowires 120a, 120b, 120c may have a different dopant concentration than the other nanowires.

In general, the MOSFET structure described here may include n vertically separated channel nanowires, where n is an integer and 2≤n≤20. The n vertically separated channel nanowires may comprise up to n different thicknesses and/or up to n different dopant concentrations and/or up to n different semiconductor materials. For any value of n, the vertically separated channel nanowires may include at least two different thicknesses and/or at least two different dopant concentrations. The vertically separated channel nanowires may also or alternatively comprise at least two different semiconductor materials having different bandgaps.

Three-dimensional numerical simulations of MOSFET devices that employ such a stacked nanowire architecture show, as discussed in detail below, that proper selection of the dopant concentrations and/or the thicknesses of the channel nanowires can lead to significant improvements in linearity, even for low power supply operation at room temperature. The inventors believe that similar effects may be obtained depending on the semiconductor materials used for the channel nanowires.

One or more of the nanowire characteristics (dopant concentration, thickness, and semiconductor material) may be varied for a given device to achieve the desired linearity. For example, the dopant concentrations may be adjusted to achieve a desired linearity even if the channel nanowires do not have the optimal thicknesses or arrangement. Similarly, the thicknesses of the channel nanowires may be controlled during deposition to improve the linearity of a device that may not have an optimal doping profile. Additionally, different semiconductor materials having different bandgaps may be used for the channel nanowires and provide a further means of tuning the linearity of the resulting MOSFET device.

Referring again to the example of FIGS. 1A and 1B, the channel nanowires 120a, 120b, 120c may comprise at least two and up to three (n=3) different thicknesses. For example, each of the thicknesses $t_a$, $t_b$, and $t_c$ may be different from each other, as shown. Alternatively, only two of the three thicknesses may be different; that is, among $t_a$, $t_b$, and $t_c$, $t_b$ may equal $t_c$, or $t_b$ may equal $t_a$, or $t_c$ may equal $t_a$.

Similarly, the channel nanowires 120a, 120b, 120c may comprise at least two and up to three (n=3) different dopant concentrations. For example, as described above, each of the dopant concentrations $N_a$, $N_b$ and $N_c$ may be different from each other. Alternatively, only two of the three dopant concentrations may be different; that is, among $N_a$, $N_b$, and $N_c$, $N_b$ may equal $N_c$, or $N_b$ may equal $N_a$, or $N_c$ may equal $N_a$. The channel nanowires 120a, 120b, 120c may also or alternatively comprise at least two and up to three different semiconductor materials having different bandgaps.

In an embodiment in which the channel nanowires comprise different thicknesses, the channel nanowires 120a, 120b, 120c may be arranged in the stack 120 such that the thicknesses decrease in a direction away from the substrate 115 and toward the top of the device 100, as shown for example in FIG. 1. Such positioning may be beneficial in because the electrostatic potential is higher for positions in the stack nearer to the top of the device 100 (and farther from the substrate 115) because of the contact scheme. The nanowires having a smaller thickness may be placed nearer to the top of the device to increase the voltage drop. Therefore, the magnitude of transconductance may be increased for the nanowires having the smaller thickness. As an alternative, it is contemplated that the channel nanowires may be arranged such that the thicknesses increase in a direction away from the substrate, or such that the thicknesses have a random order. Typically, the thicknesses of the channel nanowires 120a, 120b, 120c range in value from about 1 nm to about 500 nm, or from about 1 nm to about 100 nm, or from about 1 nm to about 50 nm.

In an embodiment in which the channel nanowires comprise different dopant concentrations, the arrangement of the channel nanowires 120a, 120b, 120c may be such that the dopant concentrations increase in a direction away from the substrate 115. Such positioning may be beneficial due to the increased electrostatic potential near to the top of the device 100, as explained above. As an alternative, it is contemplated that the channel nanowires may be arranged such that the dopant concentrations decrease in a direction away from the substrate, or such that the dopant concentrations have a random order. The dopant concentrations of the channel nanowires 120a, 120b, 120c are generally from $10^{14}$ cm$^{-3}$ to $10^{19}$ cm$^{-3}$, and the dopants may be n-type or p-type dopants.

In an embodiment in which the channel nanowires comprise at least two different semiconductor materials (each comprising a different bandgap), the channel nanowires 120a, 120b, 120c may be arranged such that the bandgaps increase in a direction away from the substrate 115 and toward the top of the device 100. This positioning may be beneficial because a lower bandgap may be associated with a lower threshold voltage and a higher current. As an alternative, it is contemplated that the channel nanowires may be arranged such that the bandgaps decrease in a direction away from the substrate, or such that the bandgaps have a random order.

As stated above, one or more of the nanowire characteristics (dopant concentration, thickness, and semiconductor material) may be varied for a given device to achieve the desired linearity. For example, the channel nanowires may include at least two different thicknesses but may have substantially the same dopant concentration and the same semiconductor material. Alternatively, the channel nanowires may comprise at least two different dopant concentrations but have substantially the same thickness and the same semiconductor material. In another example, the channel nanowires may include at least two different semiconductor materials but have substantially the same dopant concentration and thickness.

Similarly, it is contemplated that the channel nanowires may comprise at least two different dopant concentrations and at least two different semiconductor materials, but have substantially the same thickness. Alternatively, the channel nanowires may have at least two different thicknesses and at least two different dopant concentrations but comprise the same semiconductor material. In another example, the channel nanowires may comprise at least two different semiconductor materials and at least two different thicknesses, but have substantially the same dopant concentration.

The channel nanowires may be fabricated to have a channel length (distance between the source and drain, or between the source extension and drain extension) of from about 100 nm to about 800 nm, or from about 300 nm to about 600 nm. Computer simulations described below suggest that a longer channel length may be advantageous for achieving good linearity at a low drain bias. In addition, the lateral size or width of the channel nanowires may be from about 1 nm to about 500 nm, or from about 1 nm to about 300 nm, or from about 1 nm to about 100 nm. Similarly, the channel nanowires may be vertically separated by a distance y of from about 1 nm to about 500 nm, from about 1 nm to 300 nm, or from about 1 nm to about 100 nm. The distance y between adjacent channel nanowires may be the same or different throughout the stack.

The gate electrode 130 of the MOSFET device may be a dual gate, a tri-gate, an omega gate or a fully surrounded gate (i.e., gate-all-around structure), as shown schematically in FIG. 1. The gate electrode 130 may comprise polycrystalline silicon (polysilicon) or a material with a suitable work function such as WN. The gate dielectric layer 125, which isolates the channel nanowires from the gate electrode 130 and typically has an equivalent oxide thickness of from about 0.2 nm to about 20 nm, may comprise a dielectric material such as $SiO_2$, $Al_2O_3$, $HfO_2$ and/or another high-k dielectric material. The thickness of the portion of the gate dielectric layer overlying each of the channel nanowires may be different. The gate electrode 130 and the source 105 and drain 110 may be isolated by electrically insulating sidewalls or spacers 135. The gate length ($L_g$) of the device 100 (i.e., length of the gate electrode in a direction parallel to the channel nanowires) is not limited; however, short channel devices having a gate length of less than about 1 micron may see an increased benefit from the present design since nonlinearity may be more severe for smaller channel devices.

Provided below is a description of linearity in nanowire gate-all-around MOSFETs. Also explained are theoretical results for a MOSFET device architecture that employs as the high mobility channel vertically stacked III-V semiconductor nanowires of various thicknesses and doping concentrations.

Through modeling and 3D numerical simulation, it is shown that by properly adjusting the doping and dimension of the stacked nanowires individually, a significant improvement in linearity, characterized by high IP3 at maximum transconductance point $g_{m,max}$, can be achieved, even for low power supply operation at room temperature. Other metrics for high frequency RF/analog performance of the device architecture are also discussed.

First, the $g_m$ linearity of a single NW channel device is analyzed using a charge-based long channel model, which is applicable to nanowire-based gate-all-around MOSFETs operating at low electric field. This model is quantitatively specific to gate-all-around nanowire channels having a cylindrical cross-section profile. However, the model may be used for a qualitative assessment of other types devices, such as those including rectangular or omega cross-section profiles. As gate bias $V_{gs}$ increases above threshold voltage ($V_{th}$) with the difference ($V_{gs}-V_{th}$) being less than the drain bias ($V_{ds}$), the transconductance of the device can be expressed by $$g_m = \frac{2\pi\mu_{eff} RC_{ox}(V_{gs}-V_{th})}{L_{eff}}, \quad (1)$$

and when $V_{ds}=V_{gs}-V_{th}$, $g_m$ reaches its peak value $$g_{m,max} = \frac{2\pi\mu_{eff} RC_{ox} V_{ds}}{L_{eff}}, \quad (2)$$

where $\mu_{eff}$ is the effective mobility, R is the nanowire radius, $L_{eff}$ is the effective gate length which varies with channel length modulation, $C_{ox}$ is the gate oxide capacitance per unit area, and $V_{ds}$ is specified as the drain-to-source bias which excludes the voltage drop across the S/D resistance. When $V_{gs}-V_{th}$ exceeds $V_{ds}$, both $\mu_{eff}$ and $V_{ds}$ are reduced due to high field related mobility degradation and the impact of S/D resistance, respectively. Therefore, $g_m$, which has the same expression as Eq. (2), may be significantly reduced at $V_{gs}$ beyond $g_{m,max}$.

Although a cylindrical geometry with a circular transverse cross-section was assumed for the nanowires for the modeling and simulations, the nanowires may have a square or rectangular transverse cross-section when fabricated as described below. Since edges may help to concentrate the electric field, a square or rectangular cross-section may be advantageous in terms of the electrical properties of the resulting device. The nanowire radius R used in the modeling can be taken to be indicative of one-half the thickness of a fabricated channel nanowire.

Three-dimensional (3D) numerical simulation is performed using the device simulation package Sentaurus TCAD from Synopsys, Inc. (Mountain View, Calif.), employing a hydrodynamic model to incorporate non-stationary transport effects. A density-gradient equation is adopted to account for a first order quantum mechanical correction. The channel and S/D region material used in this exemplary design is GaAs.

EXAMPLE 1

Single Channel Nanowire

In this example, a single channel nanowire is uniformly p-doped at a low level (5e14 $cm^{-3}$) with a relatively large diameter ($D_{nw}$=30 nm). The doping level (dopant concentration) in the S/D regions is high (e.g., $n_{s/d}$, 1e19 cm$^{-3}$) and the doping concentration of the S/D extension is lower ($n_{ext}$, 2e18 cm$^{-3}$). The intrinsic doping-related S/D resistance is assumed to be 2 k'Ω. The nanowire channel is surrounded by a $Al_2O_3$ gate dielectric layer of 10 nm in thickness and then a gate metal with a mid-gap workfunction of 4.5 eV (e.g., WN). A moderate value of interface charge density 5e11 cm$^{-2}$ eV$^{-1}$ is assumed at the $GaAs/Al_2O_3$ interface based on published experimental data. All parameters and conditions used for the simulations are for room temperature operation.

Figure 2A:
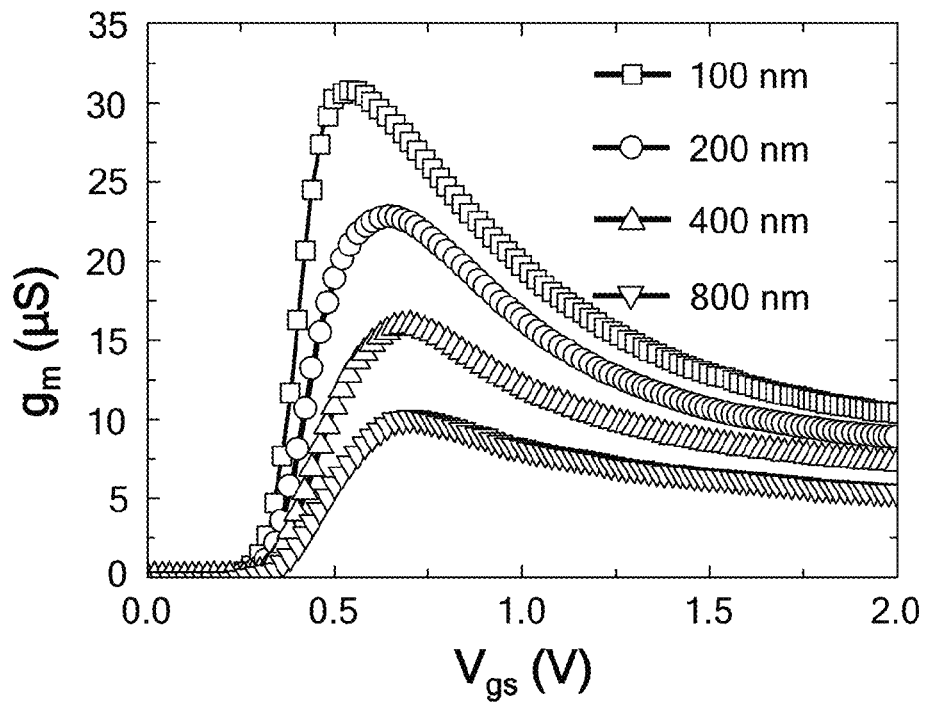
FIGS. 2A and 2B show transconductance $g_m$ as a function of gate bias $V_{gs}$ for an exemplary single nanowire gate-all-around MOSFET, with a nanowire radius of 14 nm and p-type doping concentration of 5e15 cm$^{-3}$ for (A) different $L_g$ at $V_{ds}$=0.3V and (B) different $V_{ds}$ for $L_g$=200 nm.
Figure 2B:
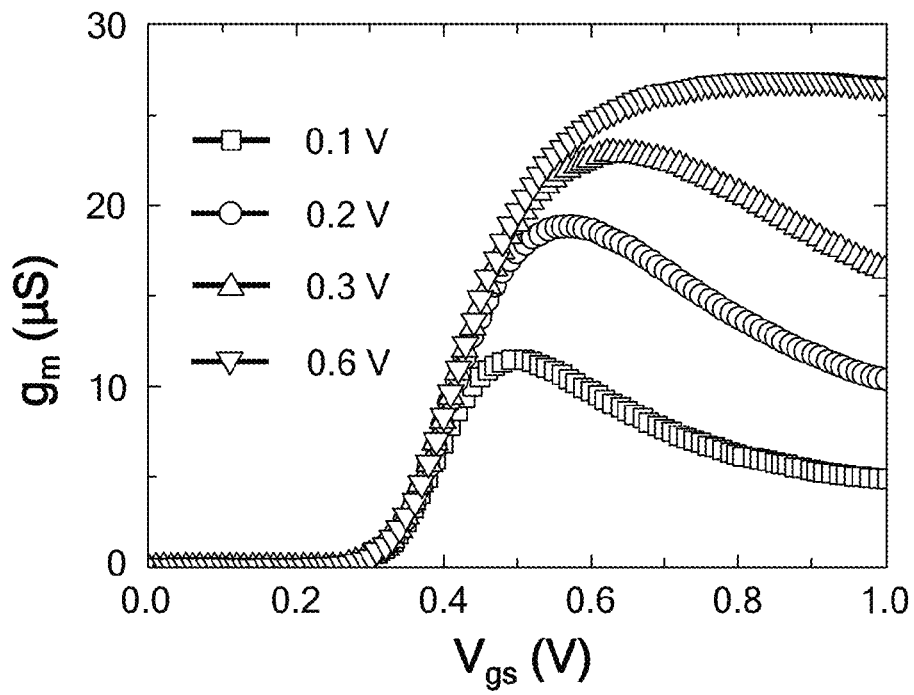

FIGS. 2A and 2B show the simulated $g_m$ vs $V_{gs}$ curves as a function of nominal gate length $L_g$ and drain bias $V_{ds}$, respectively. As $L_g$ scales down from 800 to 100 nm, the $g_m$ linearity becomes worse (FIG. 2A). This can be attributed to a larger contribution of S/D resistance as well as more severe mobility degradation for devices of smaller $L_g$.

In FIG. 2B, it is shown that the linearity improves when $V_{ds}$ increases from 0.1 to 0.6 V. This can be attributed to the counteraction of $L_{eff}$, $\mu_{eff}$, and $V_{gs}-V_{th}$. An incremental $g_m$ is expected when $V_{gs}-V_{th}<V_{ds}$ because $g_m$ increases with $V_{gs}$ as seen in Eq. (1). However, $L_{eff}$ increases more significantly due to channel length modulation and $\mu_{eff}$ drops as $V_{ds}$ increases. As a result, a higher $V_{ds}$ corresponds to a flatter $g_m$ versus $V_{gs}$ curve. The results suggest it is more challenging to achieve good linearity at low $V_{ds}$ for a nanowire gate-all-around MOSFET having a short channel.

EXAMPLE 2

Stack of Vertically Separated Channel Nanowires

Based on the analysis of a single nanowire channel as discussed above in reference to FIGS. 2A and 2B, it is recognized that several nanowire channels with different $g_m$ versus $V_{gs}$ profiles, either descending or ascending, can be superimposed within a certain range of $V_{gs}$ bias to obtain a near constant total $g_m$ for the nanowire stack, and thus overall better linearity. The profile of $g_m$ versus $V_{gs}$ curve can be tuned by changing the nanowire diameter (thickness) and doping concentration.

Hence, described below is a vertically stacked nanowire gate-all-around MOSFET structure that includes nanowires having different diameters (thicknesses) and doping concentrations, as illustrated in FIGS. 1A and 1B. The structure can be realized experimentally by growing epitaxially grown, lattice-matched (e.g., GaAs/AlGaAs) or strained (e.g., InGaAs/AlGaAs) layers with different thicknesses and doping concentrations on a semi-insulating substrate, followed by selective etching of the sacrificial (e.g., AlGaAs) layers and further processing to form a gate-all-around structure. Fabrication of the structure is described further below.

From Eq. (1), the rising slope of $g_m$ versus $V_{gs}$ in the saturation region is $2\pi\mu RC_{ox}=L_{eff}\cdot V_{th}$ determines the position of $g_{m,max}$ and can be readily tuned by the nanowire doping concentration N (cm$^{-3}$), while it decreases more modestly with an increase of the nanowire radius R.

The third (bottom-most) nanowire (NW3) is assigned to have the largest radius and a low p-type doping concentration. Thus, the NW3 channel has the lowest $V_{th}$ and largest $g_{m,max}$, and it dominates the device performance when $V_{gs}$ is low. The first and second nanowires (NW1 and NW2) which are stacked above NW3, have smaller radii and heavier p-type doping concentrations, $N_1$ and $N_2$. Therefore, these two nanowire channels are expected to exhibit a higher $V_{th}$ and smaller $g_{m,max}$. Advantageously, the descending profile of $g_m$,$R_3$ compensates the rising slope of $g_m$,$R_1$ and $g_m$,$R_2$ throughout a wide range of $V_{gs}$.

Following this approach, an exemplary stack of three channel nanowires with $N_3$ (p-type, 5e15)<$N_2$ (p-type, 3.2e18) <$N_1$ (p-type, 5.8e18) and $R_3$ (20 nm)>$R_2$ (15 nm)>$R_1$ (7 nm) is evaluated using numerical simulations. This representative set of parameters is selected to achieve a $g_m$ of NW1 and NW2 that exhibits an increase at the appropriate $V_{gs}$ range to compensate for the descent in $g_m$ of NW3.

However, the rising slope of the $g_m-V_{gs}$ curve is tied with the magnitude of $g_{m,max}$ as shown in Eq. (2). It is desirable to further increase the magnitude of $g_{m,max}$ for smaller (thinner) nanowires in order to effectively increase the overall $g_m$ flatness. The local potential $V_{ds}$ near the top surface of the device is larger because of a reduced voltage drop across S/D resistance; accordingly, NW1, NW2, and NW3 are advantageously placed from top to bottom in sequence, respectively. A spacing of 40 nm between the adjacent NWs is used for the simulation. Different S/D extension doping concentrations ($N_{ext1}$(n-type, 1e18)>$N_{ext2}$(n-type, 8e17)>$N_{ext3}$ (n-type, 5e17)) are employed in the stack. These two design considerations lead to a larger effective $V_{ds}$ for nanowire channels of smaller diameters and thus result in larger $g_{m,max}$, $R_1$ and $g_{m,max}$, $R_2$.

Figure 3:
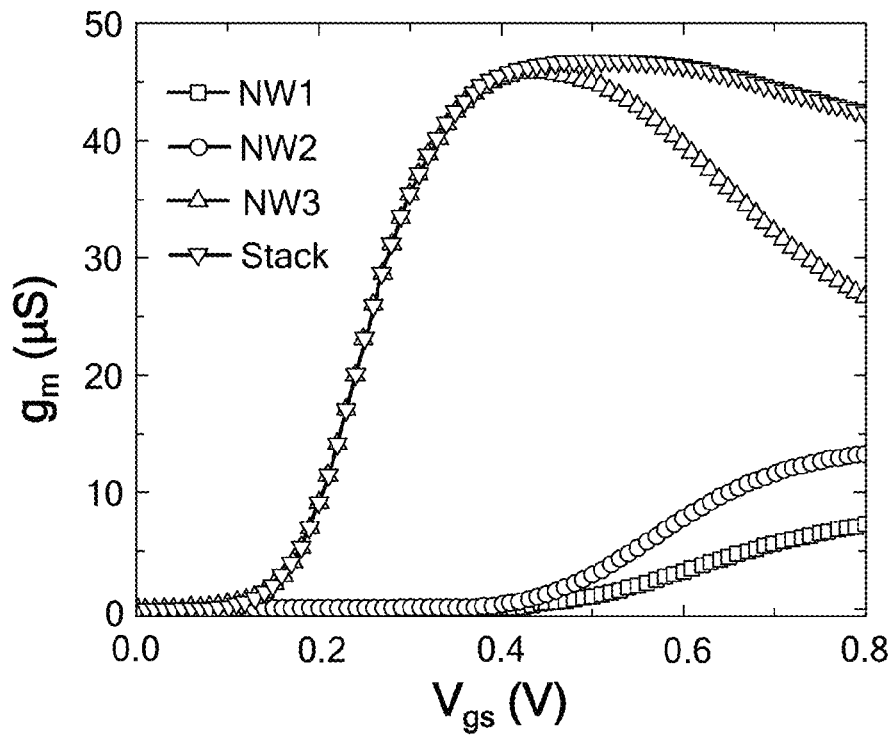
FIG. 3 shows transconductance $g_m$ versus gate bias $V_{gs}$ for NW1, NW2, NW3 and the vertically stacked NWs with $L_g$=200 nm and $V_{ds}$=0.3 V.

Table I summarizes one set of design parameters for the vertically stacked GaAs nanowire FET. Note that the design parameters are a function of material related data, i.e., high-field dependent mobility degradation and S/D parasitic resistance. These carefully designed parameters give rise to significantly improved linearity, i.e., $g_m$ is nearly independent of $V_{gs}$ over the range of 0.4-0.8 V, as shown in FIG. 3.

Accordingly, the MOSFET device comprises a source and a drain on a substrate, and a stack of n vertically separated channel nanowires that connect the source and the drain, where n is an integer and $2 \leq n \leq 20$. The n vertically separated channel nanowires are isolated from the substrate and a gate electrode is adjacent to the stack of channel nanowires. Advantageously, the transconductance ($g_m$) of the MOSFET device decreases less than about 10% from a maximum transconductance ($g_{m,max}$) over a gate bias ($V_{gs}$) range of at least about 0.3 V. The gate bias range may also be at least about 0.4 V (e.g., from about 0.4 V to about 0.8 V). The transconductance ($g_m$) of the MOSFET device may also decrease less than about 5%, or less than about 3%, from the maximum transconductance ($g_{m,max}$) over one or both of the aforementioned gate bias ranges. For example, the decrease may be less than about 7 μS, less than about 5 μS, or less than about 3 μS from the maximum transconductance ($g_{m,max}$) over one or both of the aforementioned gate bias ranges. There may also be no decrease; that is, the maximum transconductance may be substantially constant over one or both of the aforementioned gate bias ranges. Such MOSFET devices may be said to exhibit high linearity.

The MOSFET device may include any of the features or have any of the configurations described above. For example, the n vertically separated channel nanowires of the MOSFET device may comprise at least two different thicknesses and/or at least two different dopant concentrations and/or at least two different semiconductor materials. For example, the gate electrode may surround the channel nanowires in a gate-all-around configuration, and the source and the drain may be highly doped with a dopant concentration of at least about $10^{18}$ cm$^{-3}$. The n vertically separated channel nanowires may comprise up to n different thicknesses and/or up to n different dopant concentrations and/or up to n different semiconductor materials.

TABLE I

Summary of Design Parameters and Simulated Electrical Properties of Individual and Stacked Nanowire (NW) Devices for $V_{ds} = 0.3$ V

| | Radius (nm) | Doping conc. (cm$^{-3}$) | $V_{th}$(V) | $g_{m,\,max}$(μS) | $V_{gs}$@ $g_{m,\,max}$(V) |
|---|---|---|---|---|---|
| NW1 (top) | 7 | p-type 5e18 | 0.352 | 7.17 | 0.8 |
| NW2 (middle) | 15 | p-type 3e18 | 0.345 | 13.57 | 0.8 |
| NW3 (bottom) | 20 | p-type 5e15 | 0.077 | 45.84 | 0.43 |
| Total | stack | | 0.098 | 47.96 | 0.58 |

Consistent with the data of Table I, an exemplary MOSFET structure or device may comprise a stack of vertically separated nanowires where n=3, a first channel nanowire may have a thickness of from about 14-18 nm, a second channel nanowire may have a thickness of about 28-32 nm, and a third channel nanowire may comprise a thickness of about 38-42 nm. Alternatively or in addition to the thickness variation, the first channel nanowire may comprise a dopant concentration of from about 4e18 cm$^{-3}$ to about 6e18 cm$^{-3}$; a second channel nanowire may comprise a dopant concentration of from about 2e18 cm$^{-3}$ to about 4e18 cm$^{-3}$; and a third channel nanowire may comprise a dopant concentration of from about 4e15 cm$^{-3}$ to about 6e15 cm$^{-3}$.

Figure 4:
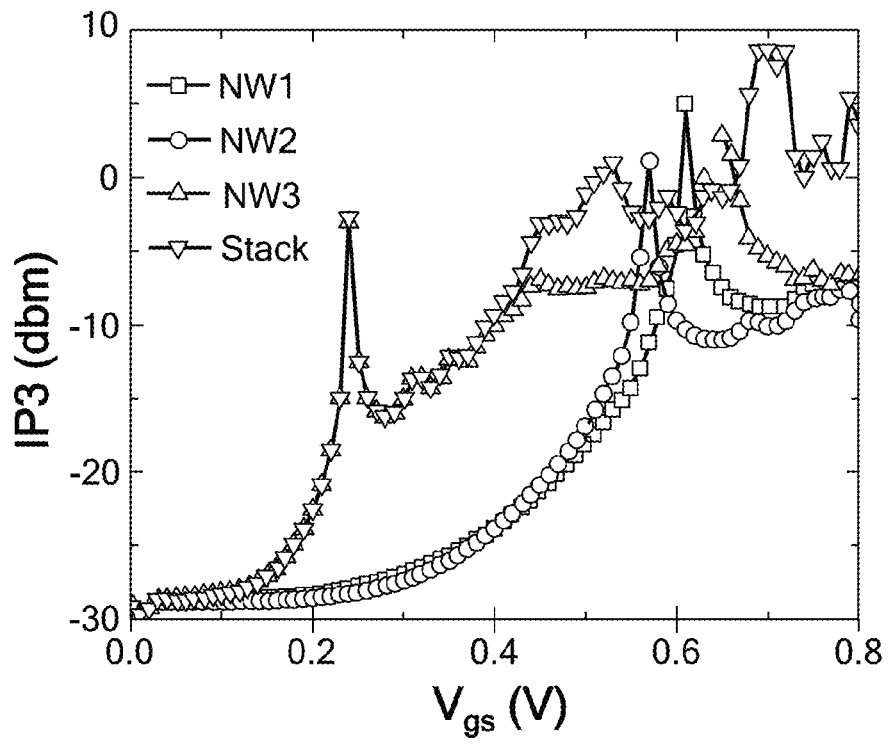
FIG. 4 shows third-order intercept point IP3 (dbm) versus gate bias $V_{gs}$ plot for NW1, NW2, NW3 and stacked NW design at $V_{ds}$=0.3V, where the dashed vertical lines indicate the $g_{m,max}$ position.

The significant improvement in linearity achieved for the structures and devices described herein is also supported by the figure of merit for linearity, the third order intercept point (IP3), which is defined as follows:

$$IP3 = \frac{2g_{m1}}{3g_{m3}R_s} = \frac{4\frac{\partial I_D}{\partial V_{gs}}}{R_s \frac{\partial^3 I_D}{\partial V_{gs}^3}}, \quad (3)$$

where $R_s$ is the source resistance, $g_{m1}$ is the transconductance, and $g_{m3}$ is its second derivative. FIG. 4 shows the calculated IP3 of an optimized vertically stacked nanowire gate-all-around MOSFET compared with the individual nanowire cases. To reduce differentiation noise, a cubic-spline interpolation was used and polynomial regression at 7th-9th degree was performed. This approach generally produces smoother IP3 curves as a function of gate bias. It can be seen that IP3 is improved from −8.86 dbm (for the best single wire, NW3) to −1.5 dbm (for the stack) at the corresponding $g_{m,max}$, which is an improvement of ~7.36 dbm. This result represents significant advancement compared with previous efforts for device level linearity improvements both in magnitude and operating voltage range.

It is worth noting that the improvement in linearity for the three-nanowire stack is bias dependent, as is the case for a device based on a single nanowire channel. One set of specific device design parameters (diameter and doping) corresponds to an optimized linearity for one specific bias range. Since the biggest linearity challenges are at a low bias condition, the exemplary stack design for linearity improvement was specifically optimized for low power application at $V_{ds}$ of 0.3 V.

Figure 5:
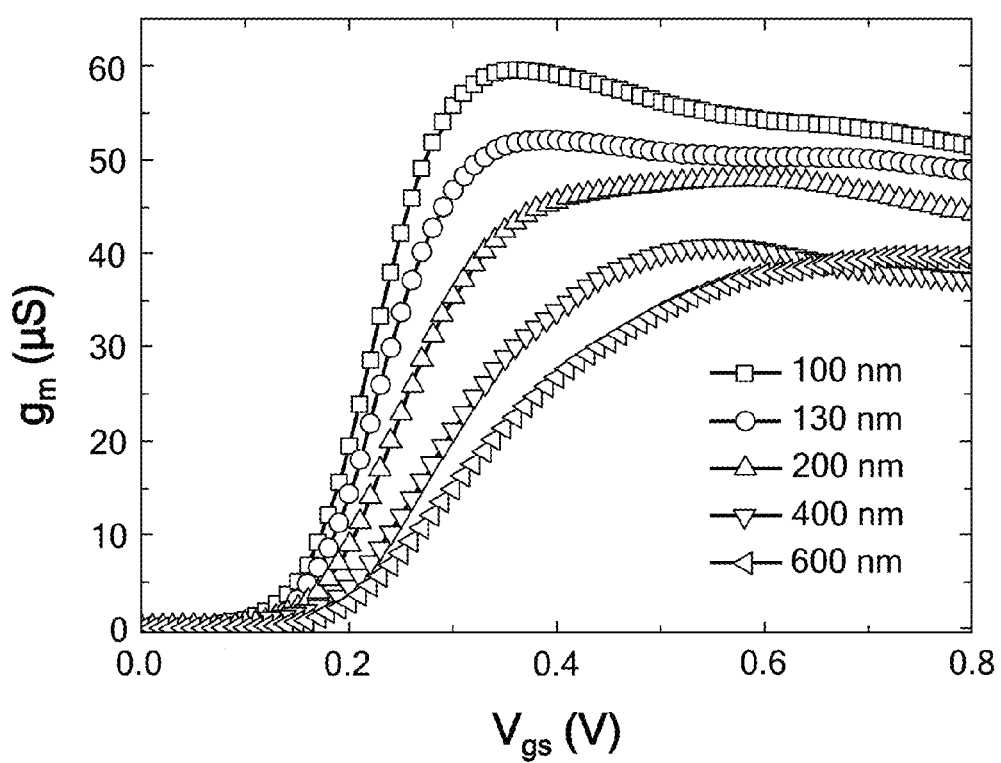
FIG. 5 shows transconductance $g_m$ as a function of gate bias $V_{gs}$ for the stacked NW design with specified gate lengths at $V_{ds}$=0.3 V.

Furthermore, as can be seen from the transfer curves shown in FIG. 5 for different gate lengths (100-600 nm), the channel length dependence of $g_m$ linearity for stacked design is much weaker, compared to the single nanowire case (FIG. 2A). This indicates that the superposition effect of stacked nanowires for linearity improvement is valid no matter how large the S/D resistance is relative to the channel resistance.

For digital circuits, this stacked NW design is expected to have excellent digital performance because of the gate-all-around structure and higher driving current density due to the stacked integration. For analog circuits, there are two important metrics: one is the intrinsic gain $g_m/g_d$ and the other is power efficiency $g_m/I_d$, in which $g_d$ is the output conductance of the transistor and $I_d$ is the drain current.

Figure 6A:
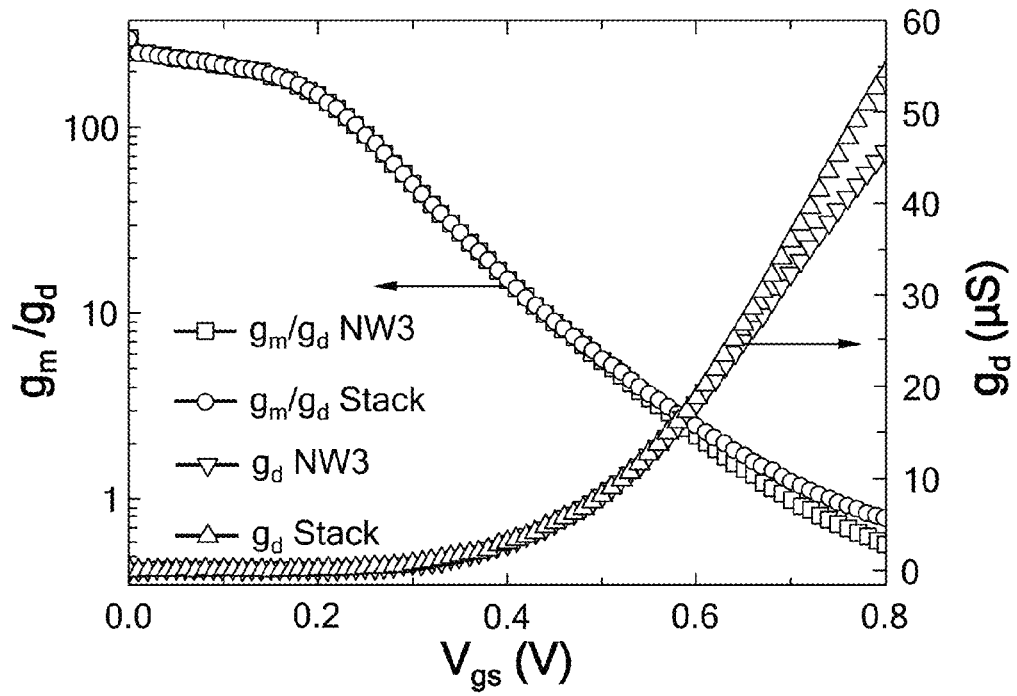
FIG. 6A shows a plot of self-gain $g_m/g_d$ and FIG. 6B shows a plot of power efficiency $g_m/I_d$, both as a function of $V_{gs}$ at $V_{ds}$=0.3 V, as well as the corresponding conductance $g_d$ and drive current $I_d$ (plotted on the respective right vertical axes).
Figure 6B:
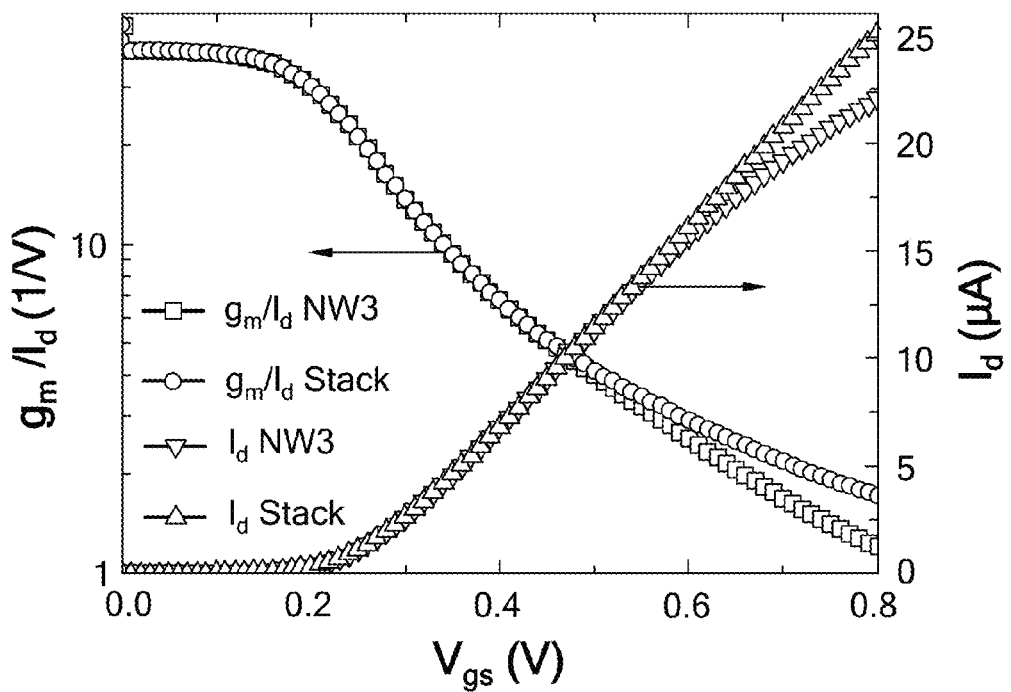

FIGS. 6A and 6B show the comparison of $g_d$ and $g_m/g_d$, and $I_d$ and $g_m/I_d$, respectively, as a function of $V_{gs}$ for the stacked design and individual nanowire (NW3). It can be seen that both $g_m/g_d$ and $g_m/I_d$ of NW3 and the stack design are at the same value when $V_{gs}$ is low. However, as $V_{gs}$ increases, $g_m/g_d$ and $g_m/I_d$ of the stacked case becomes larger than the NW3 case, even though $g_d$ and $I_d$ also increase. Thus, the vertically stacked design improves driving current without a penalty in intrinsic gain and power efficiency, which is beneficial for analog circuits.

Figure 7:
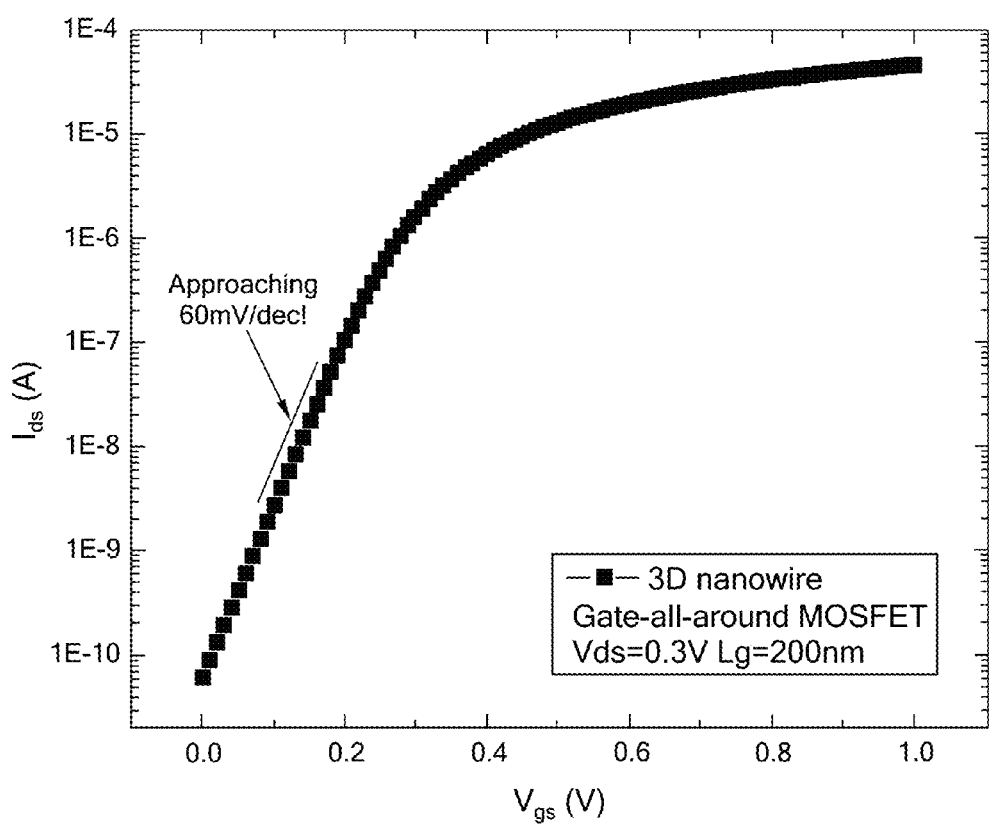
FIG. 7 shows $I_{ds}$ vs $V_{gs}$ of the stacked nanowire design from three-dimensional (3D) numerical simulated results.

FIG. 7 shows a simulated $I_{ds}$ versus $V_{gs}$ curve for the three-dimensional stacked nanowire gate-all-around MOSFETs. A nearly ideal subthreshold slope (SS) of about 60 mV/dec and $I_{on}/I_{off}$ ratio has been achieved, indicating this device also has great potential for high performance digital applications due to a strong suppression.

Figure 8A:
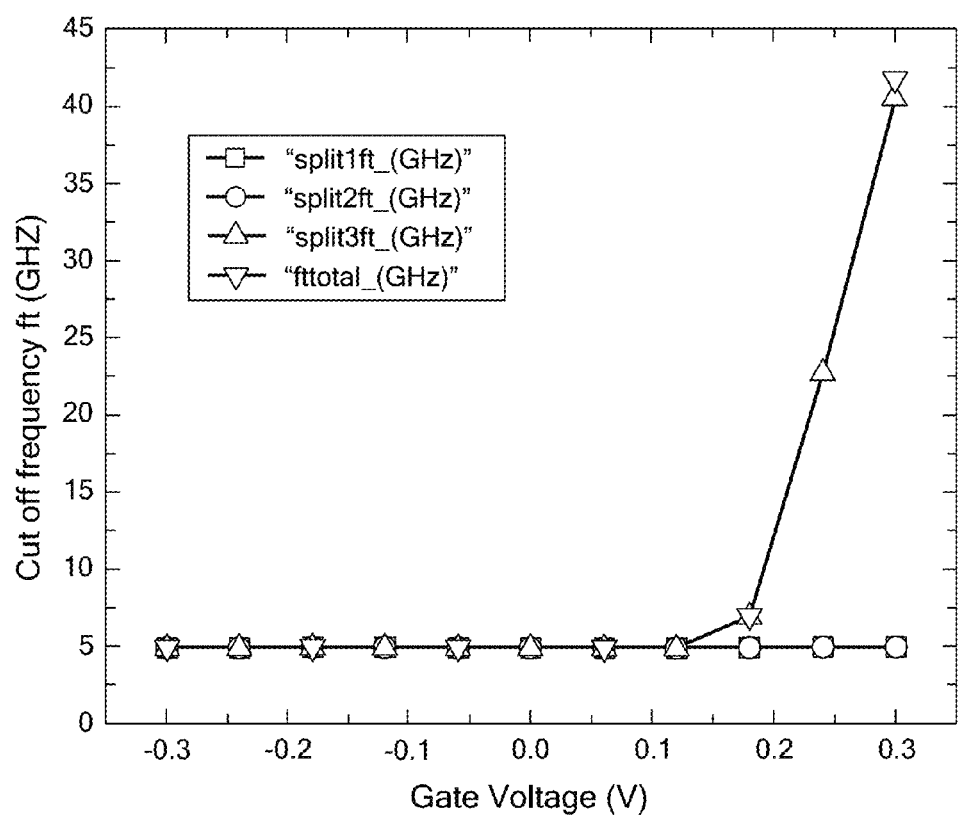
FIGS. 8A and 8B show RF performance in terms of cut-off frequency $f_T$ and maximum oscillation frequency $f_{Max}$, respectively.
Figure 8B:
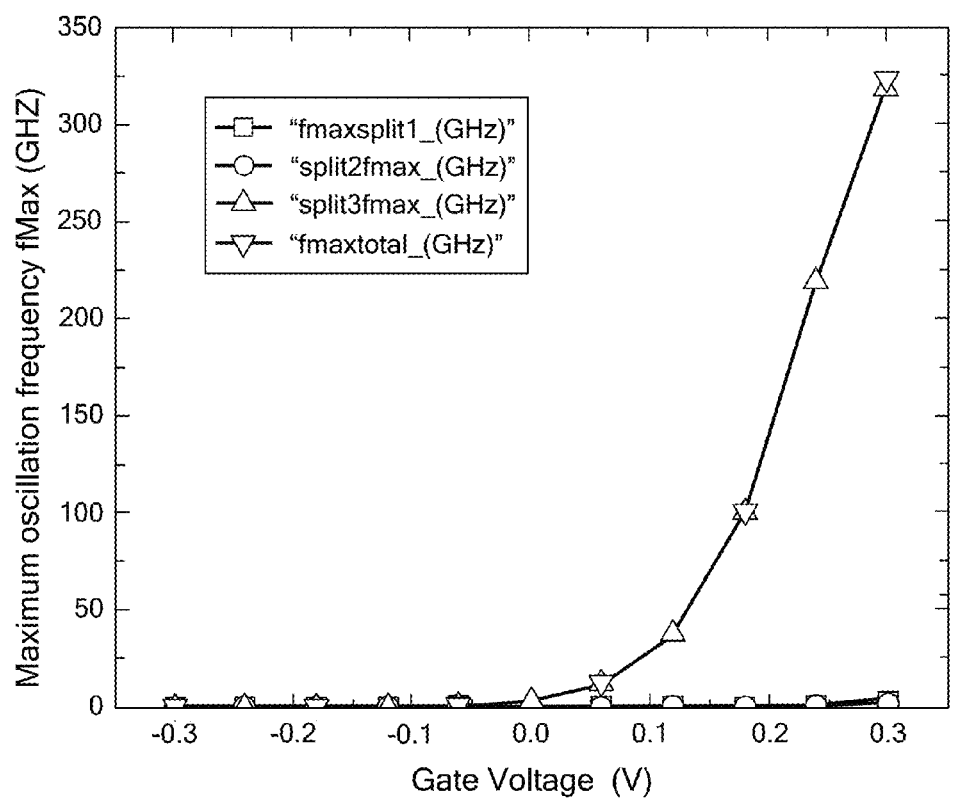

In addition, the high frequency RF performance of the stack of nanowires has been compared to that of individual nanowires using a two-port network configuration with parasitic capacitances and intrinsic resistances included in the simulation. The cut-off frequency $f_T$ was extracted by unity current gain ($Y_{21}/Y_{11}$ 1 in Y-parameter matrix). The maximum oscillation frequency $f_{max}$ was extracted by the unity mason's unilateral gain. The simulation results reveal that the high frequency metrics are dominated by the largest diameter NW3, as expected, because it has the largest $g_m$, and the stack shows only a slight improvement. $f_T$ and $f_{max}$ start to increase sharply after $V_{gs}$ is higher than 0.2 V. $f_T$ of 11 GHZ and $f_{max}$ of 140 GHZ are achieved at a low supply voltage $V_{dd}$ of 0.3 V, as indicated in FIGS. 8A and 8B.

All of these results indicate that the vertically stacked nanowire gate-all-around MOSFET design yields a good compromise between intrinsic gain $g_m/g_d$, power efficiency $g_m/I_d$, and bandwidth $f_T$ for low power consumption.

Fabrication Method

A method of making a field effect transistor structure (e.g., a MOSFET structure) is described here, first in general and then in greater detail in reference to FIGS. 9A-9L.

Figure 9A:
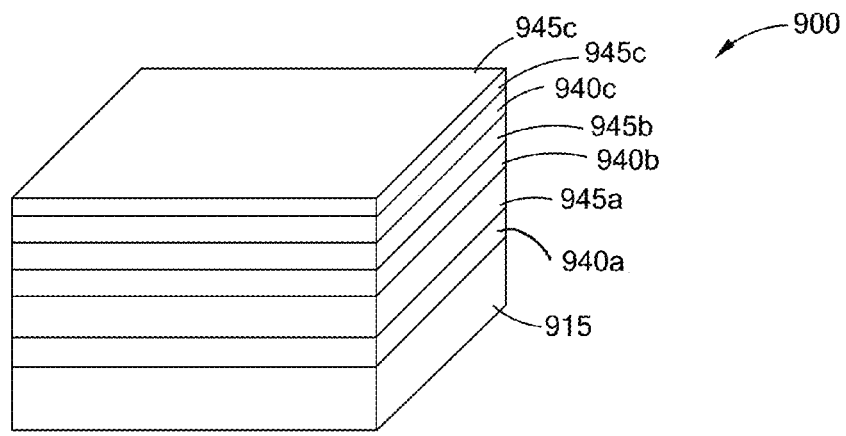
FIGS. 9A-9L illustrate an exemplary process flow to fabricate a MOSFET device comprising a stack of vertically separated channel nanowires.

A stack of layers 900 is epitaxially grown on a substrate 915, where the stack 900 includes at least two sacrificial layers comprising a first semiconductor material alternating with at least two channel layers comprising a second semiconductor material, as shown in FIG. 9A. The channel layers and the sacrificial layers may have different thicknesses and/or dopant concentrations, as discussed further below. In the present disclosure, layers that are described as being "epitaxially grown" are understood to be formed with crystallographic characteristics, such as crystal lattice structure and orientation, mirroring those of underlying layers and/or substrate. This is due to a substantial degree of lattice matching at the interface between the layers, which is characteristic of an epitaxial relationship. Accordingly, such layers may be referred to as epitaxial layers.

Material may be removed from the stack of layers 900 (e.g., by etching as described below) to form a narrowed stack of layers 970. A source 905 and a drain 910 are formed on the substrate 915 alongside the narrowed stack of layers 970 on a first side and second side thereof, respectively, such that the stack of layers 970 connects the source 905 and the drain 910. The source 905 and the drain 910 are in electrical contact with the stack of layers 970. Advantageously, the source 905 and the drain 910 are highly doped and may have a dopant concentration of at least about $10^{18}$ cm$^{-3}$.

Figure 9B:
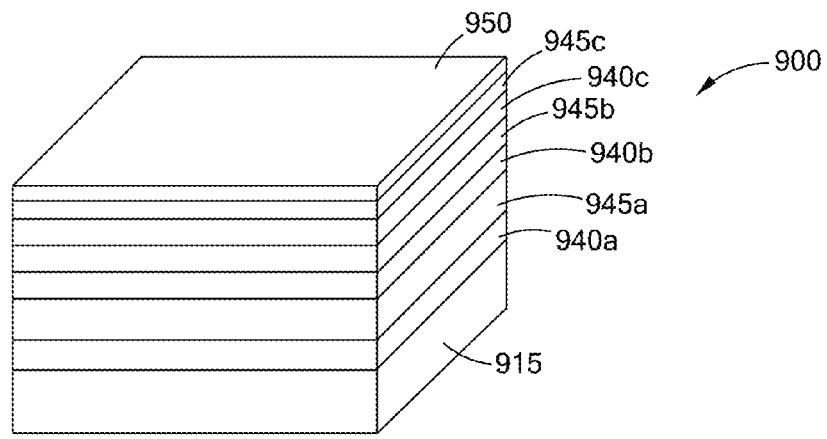
Figure 9C:
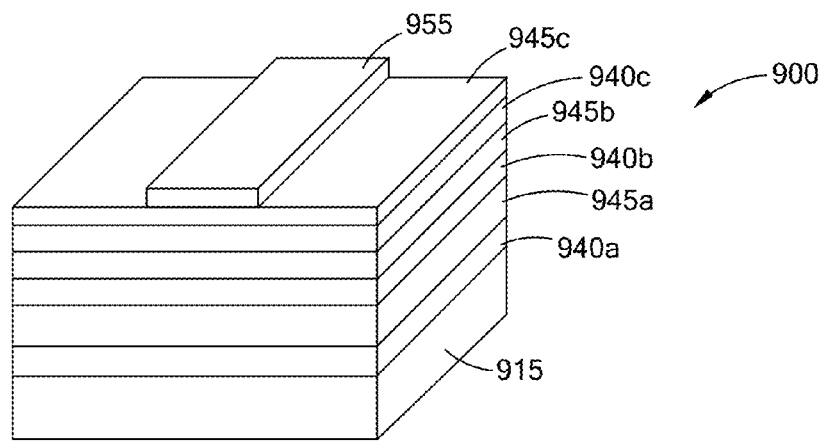
Figure 9D:
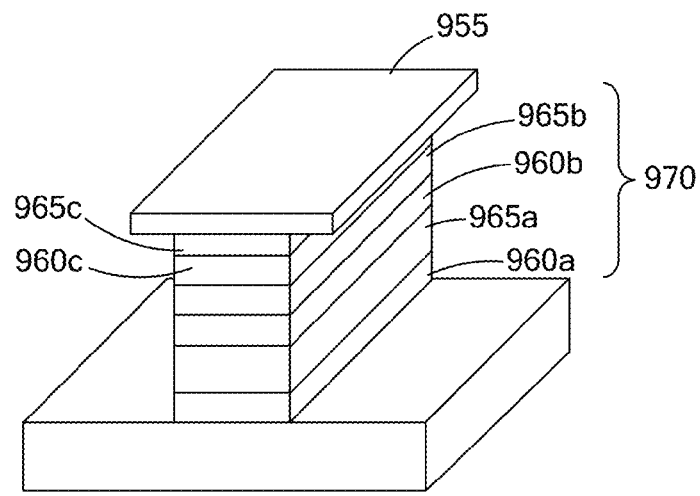
Figure 9E:
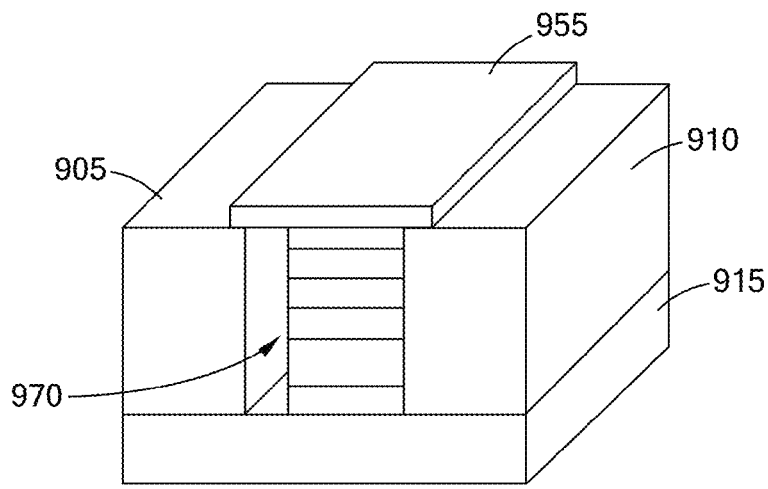

Referring to FIGS. 9B to 9D, the method further includes removing material from a third side and a fourth side of the stack of layers 970 to define a stack of wires 980 of a predetermined width connecting the source 905 and the drain 910. The stack of wires 980 comprises sacrificial nanowires 980a, 980b, 980c of the first semiconductor material alternating with channel nanowires 920a, 920b, 920c comprising the second semiconductor material. To arrive at the final nanowire structure, the sacrificial nanowires 980a, 980b, 980c comprising the first semiconductor material are removed, thereby isolating the channel nanowires 920a, 920b, 920c comprising the second semiconductor material. An exemplary process is shown in FIGS. 9E to 9I and described further below. The result is a stack 920 of vertically separated channel nanowires 920a, 920b, 920c that are isolated from the substrate 915 and that connect the source 905 and the drain 910.

As described above, the stack may include n vertically separated channel nanowires, where n is an integer and $2 \leq n \leq 20$. The n vertically separated channel nanowires may comprise up to n different thicknesses and/or up to n different dopant concentrations and/or up to n different semiconductor materials. Any of the MOSFET structure configurations described above may be formed according to the method described here.

Figure 9F:
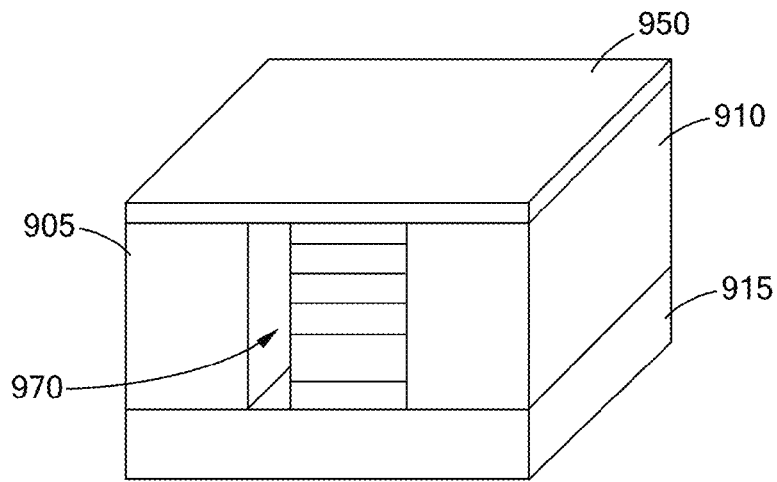
Figure 9G:
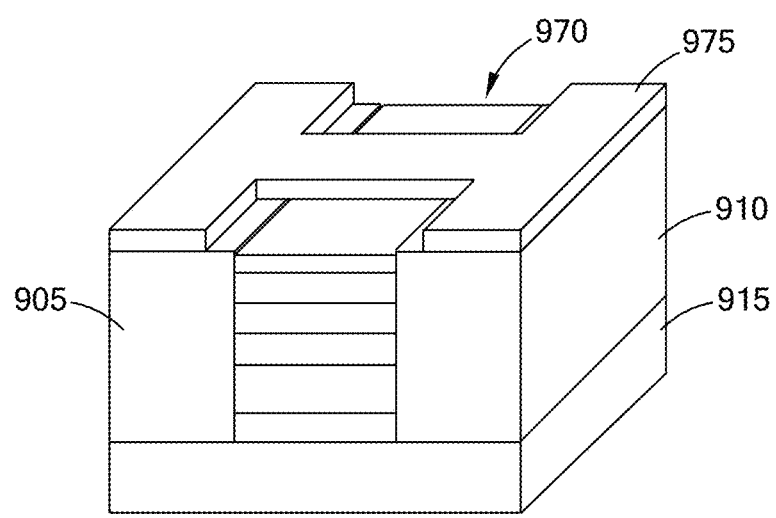
Figure 9H:
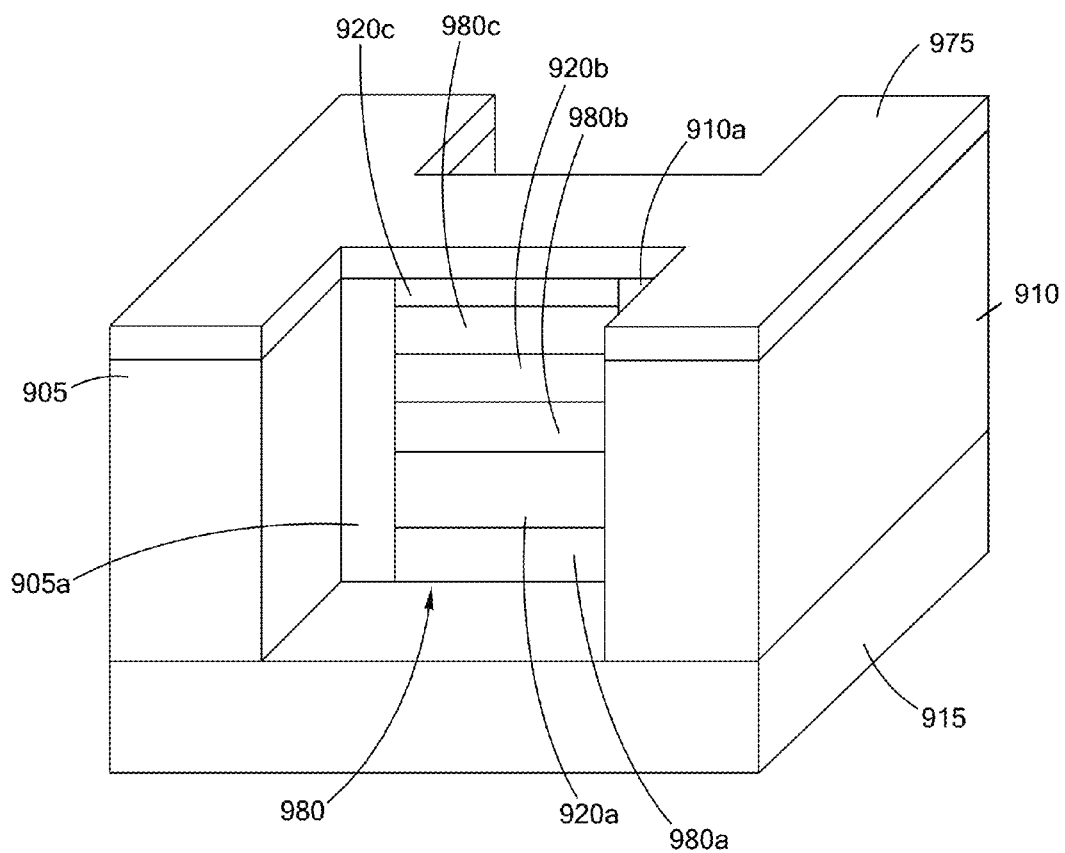
Figure 9I:
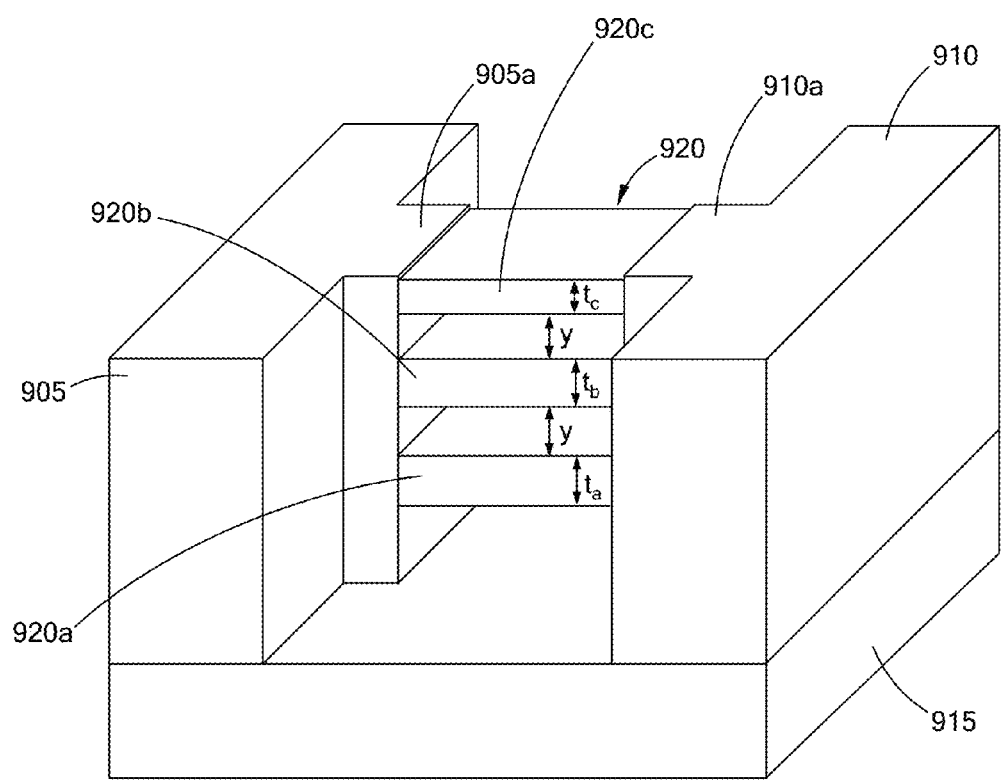
Figure 9J:
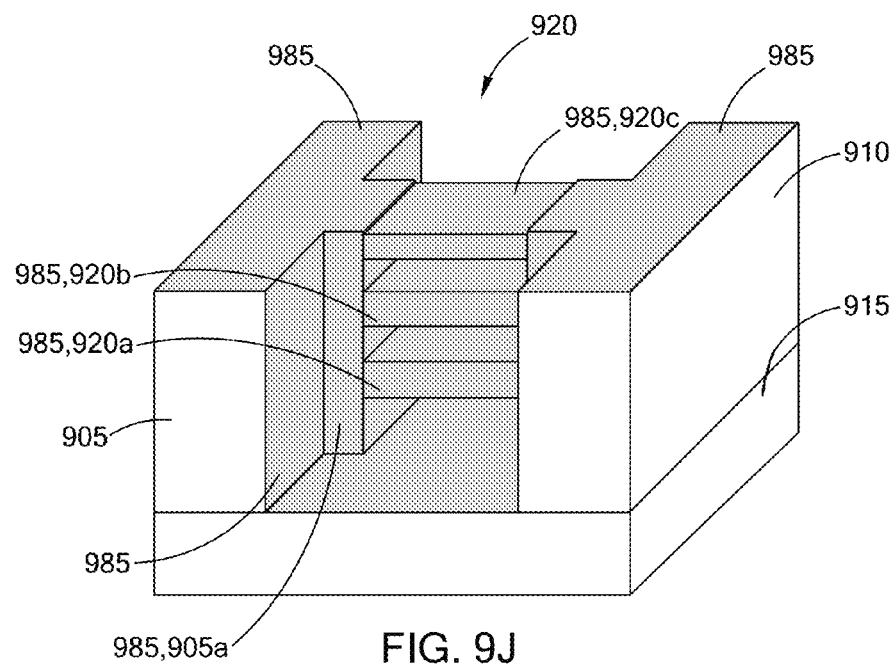
Figure 9K:
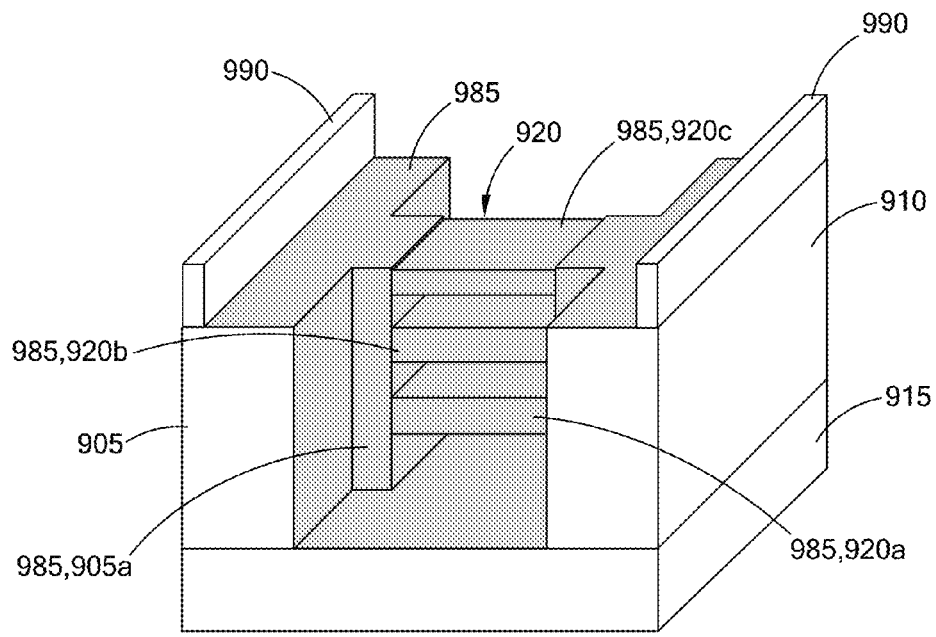
Figure 9L:
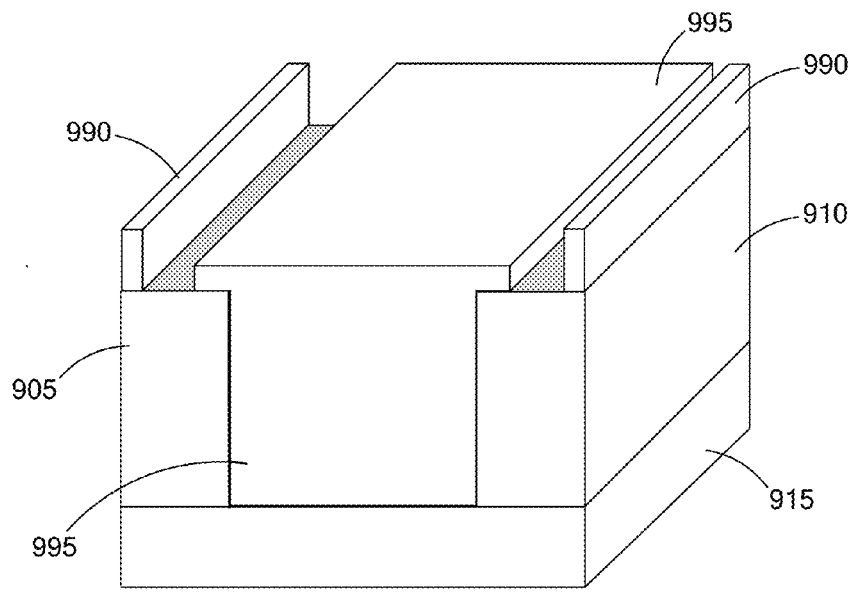
Figure 10A:
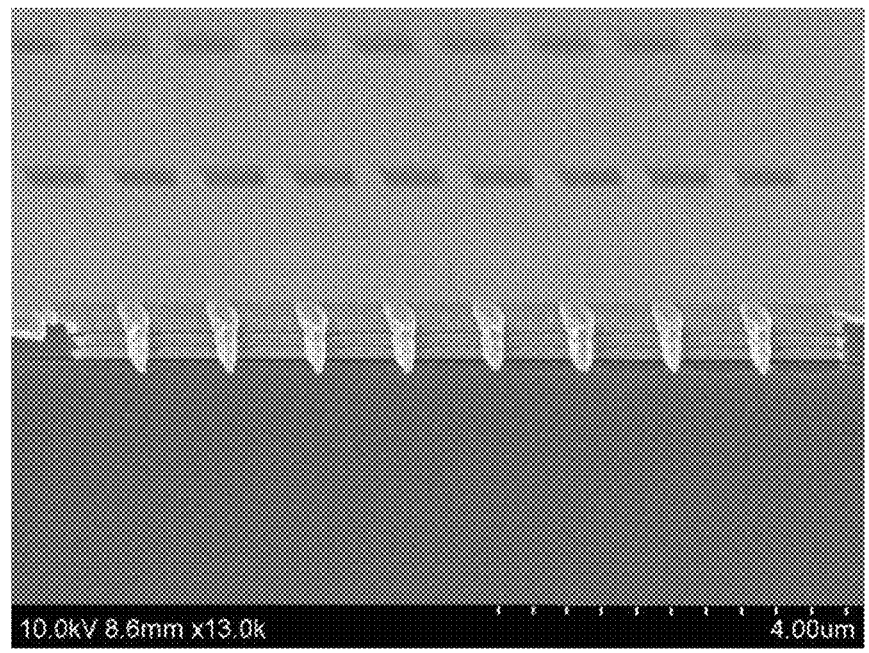
FIGS. 10A and 10B are scanning electron microscope (SEM) images of a stack of vertically separated channel nanowires surrounded by a gate metal deposited by sputtering.
Figure 10B:
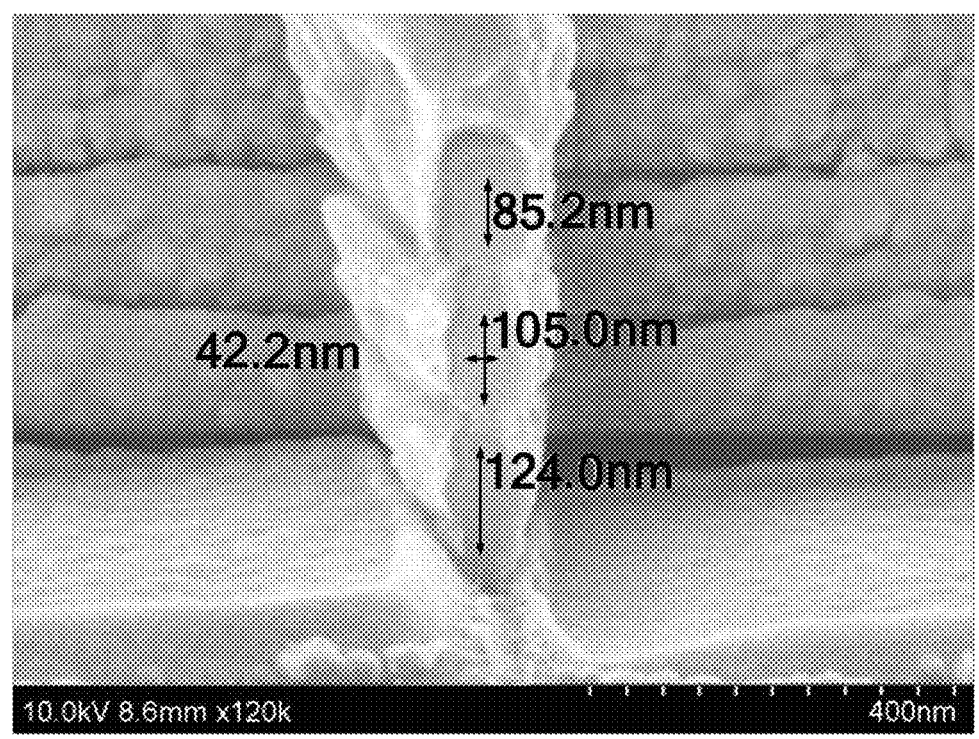

Referring to FIGS. 9J to 9L, the method may further include conformally coating each of the vertically separated channel nanowires 920a, 920b, 920c with a gate dielectric layer 985 to form insulated channel nanowires 920a, 920b, 920c, and an electrically conductive material may be deposited on a portion of each of the source and the drain to form source/drain contacts 990. A gate metal material may be deposited over the insulated channel nanowires to form a gate electrode structure 995. The gate electrode structure 995 may be selected from the group consisting of a double gate, trigate, omega gate or fully surrounded gate.

Various aspects of the above-described method are now discussed in more detail in reference to FIGS. 9A to 9L.

Epitaxially growing the stack of layers 900 on the substrate 915 may be carried out using a deposition method known in the art, such as metalorganic chemical vapor deposition (MOCVD) or molecular beam epitaxy (MBE). The stack of layers 900 may include sacrificial layers 940a, 940b, 940c comprising the first semiconductor material and channel layers 945a, 945b, 945c comprising the second semiconductor material, as shown in FIG. 9A. The alternating sacrificial and channel layers may be lattice-matched (e.g., GaAs/AlGaAs) or strained (e.g., InGaAs/AlGaAs) layers on a semi-insulating substrate (e.g., semi-insulating GaAs (100)), which may reduce current leakage. An n-type dopant, such as Si or Te, may be used as a dopant for the channel layers.

The thickness of the channel layers 945a, 945b, 945c and sacrificial layers 940a, 940b, 940c may be controlled by adjusting the growth time or growth rate in a MOCVD or other epitaxial system. For example, three channel layers 945a, 945b, 945c comprising GaAs may be deposited alternately with three sacrificial layers 940a, 940b, 940c comprising AlGaAs. Each of the three channel layers 945a, 945b, 945c (which ultimately become the channel nanowires) may have a different thickness and doping concentration, as shown for example in Table II below. Each of the AlGaAs sacrificial layers may have a thickness of about 100 nm and intrinsic doping. Since the sacrificial layers 940a, 940b, 940c are ultimately removed to form the channel nanowires, the thickness of the sacrificial layers 940a, 940b, 940c determines the vertical spacing (y) between the nanowires in the stack, as discussed further below.

TABLE II

Exemplary Nanowire Thicknesses and Dopant Concentrations for a 3-Nanowire Stack

| | Thickness (nm) | Dopant Concentration (cm$^{-3}$) |
|---|---|---|
| NW1 (top) | 16 | 5.8e18 |
| NW2 (middle) | 30 | 3.2e18 |
| NW3 (bottom) | 40 | 5e15 |

The source 905 and the drain 910 may be formed by regrowth after lithography and etching of the stack of layers 900, or by ion implantation and high temperature annealing.

For example, in the case of regrowth, a hard mask material 950 such as SiO$_2$ or SiN may be deposited on top of the epitaxially grown stack of layers 900 by plasma enhanced chemical vapor deposition (PECVD) or another technique, as shown schematically in FIG. 9B. Lithography and etching (e.g., with hydrofluoric acid (HF) solution) may then be employed to define the desired mask pattern in the hard mask material 950.

Once the hard mask material 950 has been patterned, an additional etching step may be used to remove material from the stack, consistent with the mask pattern 955, in order to create a narrowed stack of layers 970 next to which a source 905 and a drain 910 may be formed, as shown in FIGS. 9C and 9D. The narrowed stack of layers 970 includes narrowed sacrificial layers 960a, 960b, 960c and narrowed channel layers 965a, 965b, 965c. It is advantageous to use an etching method that minimizes defect formation so that a high quality interface may be formed between the narrowed channel layers 965a, 965b, 965c and the source and drain 905, 910 during the subsequent regrowth process. For example, a wet etch with H$_2$SO$_4$:H$_2$O$_2$:DI H$_2$O=1:8:80 may be used for the additional etching step. Alternatively a MacEtch process, such as described in U.S. Pat. Nos. 6,762,134 and 6,790,785, which are hereby incorporated by reference, may be employed to create the narrowed stack of layers 970.

Regrowth using MOCVD or another deposition technique may then be used to form the source 905 and drain 910, which may be highly doped (e.g., Si-doped GaAs at a concentration of 5e18 cm$^{-3}$). The source 905 may include a source extension 905a in direct contact with the first side of the narrowed stack of layers 970 and the drain 910 may include a drain extension 910a in direct contact with the second side of the narrowed stack of layers 700. The source and drain extensions 905a, 910a may have a different (e.g., lower) dopant concentration than the source 905 and drain 910.

Referring to FIG. 9F, the hard mask pattern 955 may be removed by etching and a second hard mask material 950 may be deposited over the stack of layers 700 and the source 905 and drain 910 using PECVD, for example. The second hard mask material 950 may be lithographically patterned and etched to have a fin configuration 975, as shown in FIGS. 9G and 9H. For example, a dry etch method, such as reactive ion etching (RIE) (e.g., to a depth of 100 nm) may be used to pattern the hard mask 950. Another dry etching step, such as inductively coupled plasma (ICP) RIE, may be employed to remove material (e.g., to a depth of 400 nm) from the stack of layers 700 to define a stack of wires 980 of a predetermined width connecting the source 905 and the drain 910. This step may also be referred to as fin formation. The stack of wires 980 that results comprises sacrificial nanowires 980a, 980b, 980c of the first semiconductor material alternating with channel nanowires 920a, 920b, 920c comprising the second semiconductor material.

The sacrificial nanowires 980a, 980b, 980c comprising the first semiconductor material are then removed so as to isolate the channel nanowires 920a, 920b, 920c and arrive at the desired stacked structure 920, as shown schematically in FIG. 9I. The removal may be carried out by a suitable etching process, and thus it is advantageous for the first semiconductor material to comprise a different etching selectivity from the second semiconductor material. The second hard mask having the fin configuration 975 is also removed during the etching process. An exemplary etching solution, in the case of GaAs channel nanowires and AlGaAs sacrificial nanowires, is a 25% diluted HF acid solution. The result, after wet etching, is a stack of vertically separated channel nanowires 920a, 920b, 920c that are isolated from the substrate 915 and that connect the source 905 and the drain 910.

Referring to FIG. 9J, the method may further include conformally coating each of the vertically separated channel nanowires 920a, 920b, 920c with a gate dielectric layer 985 to form electrically insulated channel nanowires 920a, 920b, 920c. This may entail surface passivation of the channel nanowires 920a, 920b, 920c, followed by atomic layer deposition (ALD) of a dielectric material. After deposition, an anneal may be used to improve the surface conditions of the deposited dielectric material. For example, the channel nanowires may be exposed to $(NH_4)_2S$ for a short time duration (e.g., about 10 minutes) before depositing a thin layer of $Al_2O_3$ (e.g., a 9-10 nm layer), and then a rapid thermal anneal (RTA) may be carried out at 650° C. for about 15 seconds to obtain a high quality dielectric layer 985.

An additional lithography and etching step may be used to create openings in the dielectric layer for deposition of an electrically conductive material to form source/drain contacts 990, as shown in FIG. 9K. For example, a buffered oxide etch (BOE) may be employed for about 10 seconds after lithographic patterning to form the openings, and then a stack of Ge/Au/Ni/Au layers may be deposited, followed by lift-off and annealing (e.g., 420° C. for 90 seconds) in order to form ohmic source/drain contacts 990.

Another lithographic patterning step may be employed to expose a region of the dielectric layer 985 for deposition of the gate metal, which is aligned with the channel nanowires 920a, 920b, 920c. For example, after patterning, isotropic sputtering may be carried out from two or more different angles with respect to the stack of nanowires 920 to surround the electrically insulated channel nanowires 920a, 920b, 920c with the gate metal (e.g., Ti/Au), followed by lift off. As an alternative to isotropic sputtering, ALD or evaporation may be used to deposit the gate metal and form the gate electrode structure 995, as shown for example in FIG. 9L. The gate electrode structure 995 may be a double gate, tri-gate, omega gate or fully surrounded gate. An optional step is to isolate the gate electrode and the source/drain with sidewalls formed by deposition of a thin layer of dielectric material.

The new field effect transistor design and process technology are believed to be practical and low cost. Not only can good linearity be obtained at room temperature, but also the stacked nanowire structure can generate large transconductance and achieve excellent values of subthreshold slope, drain induced barrier lowering and on-off ratio. Also excellent is RF performance in terms of gain, cut off frequency, and maximum oscillation frequency. The various advantages make this new design very promising for commercial purpose implementation.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A field effect transistor structure comprising:
a source and a drain on a substrate; and
a stack of n vertically separated channel nanowires isolated from the substrate and connecting the source and the drain, where n is an integer and $2 \leq n \leq 20$, and where a vertical direction is substantially perpendicular to the substrate, the n vertically separated channel nanowires collectively comprising at least two different thicknesses and/or at least two different dopant concentrations and/or at least two different semiconductor materials.

2. The transistor structure of claim 1, wherein the channel nanowires are arranged in the stack such that the thicknesses decrease in a direction away from the substrate.

3. The transistor structure of claim 1, wherein the channel nanowires are arranged in the stack such that the dopant concentrations increase in a direction away from the substrate.

4. The transistor structure of claim 1, wherein each of the semiconductor materials comprises a bandgap, and wherein the channel nanowires are arranged in the stack such that the bandgaps increase in a direction away from the substrate.

5. The transistor structure of claim 1, wherein the n vertically separated channel nanowires comprise up to n different thicknesses and/or up to n different dopant concentrations and/or up to n different semiconductor materials.

6. The transistor structure of claim 1, wherein the at least two different thicknesses are selected from about 1 nm to about 500 nm.

7. The transistor structure of claim 1, wherein the at least two different dopant concentrations are selected from about $10^{14}$ cm$^{-3}$ to $10^{19}$ cm$^{-3}$.

8. The transistor structure of claim 1, wherein the at least two different semiconductor materials are selected from the group consisting of: GaAs, InAs, InP, GaP, InGaAs, InGaP, InSb, GaSb, InGaSb, InP, GaP, InGaP, InN, GaN, and InGaN.

9. The transistor structure of claim 1, wherein the channel nanowires are vertically separated by a distance of from about 1 nm to about 100 nm.

10. The transistor structure of claim 1, wherein the source and the drain comprise a dopant concentration of at least about $10^{18}$ cm$^{-3}$.

11. The transistor structure of claim 1, further comprising a gate electrode surrounding the channel nanowires and separated therefrom by a gate dielectric material, the gate electrode comprising a gate-all-around configuration.

12. The transistor structure of claim 1, wherein the n vertically separated channel nanowires collectively comprise at least two different thicknesses.

13. The transistor structure of claim 1, wherein the n vertically separated channel nanowires collectively comprise at least two different dopant concentrations.

14. The transistor structure of claim 1, wherein the n vertically separated channel nanowires collectively comprise at least two different thicknesses and at least two different dopant concentrations.

15. The transistor structure of claim 14, wherein the channel nanowires further comprise at least two different semiconductor materials.

16. The transistor structure of claim 1, wherein the source and the drain are formed on the substrate by a regrowth process.

17. The transistor structure of claim 1, wherein each of the n vertically separated channel nanowires comprise an n-type dopant.

18. The transistor structure of claim 1, wherein each of the n vertically separated channel nanowires comprise a p-type dopant.

19. The transistor structure of claim 1, further comprising a gate electrode adjacent to the stack of channel nanowires, wherein, over a gate bias ($V_{gs}$) range of at least about 300 mV, a transconductance ($g_m$) of the field effect transistor structure decreases less than about 10% from a maximum transconductance ($g_{m,max}$).

20. A MOSFET device comprising:
a source and a drain on a substrate;
a stack of n vertically separated channel nanowires isolated from the substrate and connecting the source and the drain, where n is an integer and $2 \leq n \leq 20$, and where a vertical direction is substantially perpendicular to the substrate; and
a gate electrode adjacent to the stack of channel nanowires, wherein, over a gate bias ($V_{gs}$) range of at least about 300 mV, a transconductance ($g_m$) of the MOSFET device decreases less than about 10% from a maximum transconductance ($g_{m,max}$).

21. The MOSFET device of claim 20, wherein the n vertically separated channel nanowires collectively comprise at least two different thicknesses and/or at least two different dopant concentrations and/or at least two different semiconductor materials.

22. The MOSFET device of claim 20, wherein the gate bias range is at least about 400 mV.

23. The MOSFET device of claim 20, wherein the gate electrode surrounds the channel nanowires, the gate electrode comprising a gate-all-around configuration.

24. The MOSFET device of claim 20, wherein the source and the drain comprise a dopant concentration of at least about $10^{18}$ cm$^{-3}$.

* * * * *